United States Patent
Schmidt et al.

(10) Patent No.: US 7,611,641 B2
(45) Date of Patent: Nov. 3, 2009

(54) ILLUMINATION SYSTEM COMPRISING A RADIATION SOURCE AND A FLUORESCENT MATERIAL

(75) Inventors: Peter J. Schmidt, Aachen (DE); Thomas Jüstel, Witten (DE); Henning Höppe, Kirchanschöring (DE); Wolfgang Schnick, Gauting (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 453 days.

(21) Appl. No.: 10/598,016

(22) PCT Filed: Feb. 10, 2005

(86) PCT No.: PCT/IB2005/050521

§ 371 (c)(1),
(2), (4) Date: Aug. 16, 2006

(87) PCT Pub. No.: WO2005/080706

PCT Pub. Date: Sep. 1, 2005

(65) Prior Publication Data

US 2008/0157653 A1    Jul. 3, 2008

(30) Foreign Application Priority Data

Feb. 20, 2004 (EP) .................................. 04100692

(51) Int. Cl.
*H01L 33/00* (2006.01)
*C09K 11/79* (2006.01)

(52) U.S. Cl. ............................... 252/301.4 F; 313/503; 257/98

(58) Field of Classification Search ........... 252/301.4 F; 313/503; 257/98
See application file for complete search history.

(56) References Cited

U.S. PATENT DOCUMENTS

| 4,928,017 | A | 5/1990 | Kemmler-Sack et al. |
| 5,998,925 | A | 12/1999 | Shimizu et al. |
| 7,262,439 | B2 * | 8/2007 | Setlur et al. .................... 257/98 |
| 7,442,326 | B2 * | 10/2008 | Setlur et al. ........... 252/301.4 F |
| 2001/0013591 | A1 | 8/2001 | Park et al. |
| 2003/0052595 | A1 | 3/2003 | Ellens et al. |

* cited by examiner

*Primary Examiner*—C. Melissa Koslow

(57) ABSTRACT

An illumination system includes a radiation source and a fluorescent material including at least one phosphor capable of absorbing a part of light emitted by the radiation source and emitting light of wavelength different from that of the absorbed light. The phosphor includes a yellow red-emitting cerium-activated carbido-nitridosilicate of general formula $(RE_{1-z})_{2-a}EA_a Si_4 N_{6+a}C_{1-a}:Ce_z$ where $0 \leq a<1$, $0<z \leq 0.2$, EA is at least one earth alkaline metal selected from the group of calcium, strontium and barium, and RE is a least one rare earth metal chosen from the group of yttrium, gadolinium and lutetium. The phosphor may include a red to yellow-emitting cerium-activated carbido-nitridosilicate of general formula $(RE_{1-z})_{2-a}EA_a Si_4 N_{6+a}C_{1-a}:Ce_z$ where $0 \leq a<1$, $0<z \leq 0.2$, EA is at least one earth alkaline metal selected from the group of calcium, strontium and barium, and RE is a least one rare earth metal chosen from the group of yttrium, gadolinium and lutetium.

8 Claims, 5 Drawing Sheets

ILLUMINATION SYSTEM COMPRISING A RADIATION SOURCE AND A FLUORESCENT MATERIAL

The present invention generally relates to an illumination system comprising a radiation source and a fluorescent material comprising a phosphor. The invention also relates to a phosphor for use in such illumination system.

More particularly, the invention relates to an illumination system and fluorescent material comprising a phosphor for the generation of specific, colored light, including white light, by luminescent down conversion and additive color mixing based an a ultraviolet or blue radiation emitting radiation source. A light-emitting diode as a radiation source is especially contemplated.

Recently, various attempts have been made to make white light emitting illumination systems by using light emitting diodes as radiation sources. When generating white light with an arrangement of red, green and blue light emitting diodes, there has been such a problem that white light of the desired tone cannot be generated due to variations in the tone, luminance and other factors of the light emitting diodes.

In order to solve these problems, there have been previously developed various illumination systems, which convert the color of light, which is emitted by light emitting diodes, by means of a fluorescent material comprising a phosphor to provide a visible white light illumination.

Previous white light illumination systems have been based in particular either an the trichromatic (RGB) approach, i.e. an mixing three colors, namely red, green and blue, in which case the latter component of the output light may be provided by a phosphor or by the primary emission of the LED or in a second, simplified solution, an the dichromatic (BY) approach, mixing yellow and blue colors, in which case the yellow secondary component of the output light may be provided by a yellow phosphor and the blue component may be provided by a phosphor or by the primary emission of blue LED.

In particular, the dichromatic approach as disclosed e.g. U.S. Pat. No. 5,998,925. uses a blue light emitting diode of InGaN semiconductor combined with an Y3A15O12:Ce (YAG–Ce 3+) phosphor. The YAG–Ce$^{3+}$ phosphor is coated on the InGaN LED, and a portion of the blue light emitted from the LED is converted to yellow light by the phosphor. Another portion of the blue light from the LED is transmitted through the phosphor. Thus, this system emits both blue light emitted from the LED, and yellow light emitted from the phosphor. The mixture of blue and yellow emission bands are perceived as white light by an observer with a typical CRI in the middle 70s and a color temperature Tc, that ranges from about 6000 K to about 8000 K A concern with the LED according to U.S. Pat. No. 5,998,925 is that the "white" output light has an undesirable color balance for a true color rendition.

For true color rendition the figure of merit is the color rendering index (CRI). Color rendering index (CRI) measurement is a relative measurement of how the color rendition of an illumination system compares to that of a black body radiator. The CRI equals 100 if the color coordinates of a set of test colors being illuminated by the illumination system are the same as the coordinates of the same test colors being irradiated by a black body radiator.

Colors in general have the role of providing various information on the visual environment for humans, colors have a particularly great role among the visual information received by car drivers of cars driving on roads or in tunnels. For example, distinguishing lane marking white and yellow in a tunnel is very important to know whether lane changing is permitted or not. However, on roads and in tunnels which are illuminated by lamps of low CRI, it has been difficult to distinguish the white and yellow lane markings on the road surface.

Also an important thing in color recognition is that the red of a surface color be recognized as red. Because red, in particular, is coded for important meanings such as danger, prohibition, stop and fire fighting. Therefore important point in improving the visual environment from the view point of safety is an illumination, that enhances red surfaces.

In case the B-Y base light source of dichromatic radiation type described previously is used in such a situation, there occurs such a problem that the probability of recognizing red which is an important color for the indication of danger is reduced due to the lack of spectrum in the red region of the visible light spectrum (647-700 nm range). The red deficiency in the output white light causes illuminated red objects to appear less intense in color than they would under a white light having a well-balanced color characteristic.

Improved efficiency and much improved color rendering ability may be possible with the dichromatic lamp spectrum according to the (BY)-approach having two emission bands: red at 590 to 630 and blue at 420 to 480 nm. These wavelengths are near to the peaks in the CIE tristimulus function which are used to define colors.

Unfortunately, until today a red emitting phosphor with an emission peak wavelength in the range of 590 to 630 nm with sufficient efficiency and stability is not known.

Therefore, there is a need to provide new phosphors that are excitable by a radiation source of the near UV-to-blue range and emit in the visible yellow to red range.

Desirable characteristics for illumination systems for general purposes are also high brightness at economical cost.

Thus the present invention provides an illumination system, comprising a radiation source and a fluorescent material comprising at least one phosphor capable of absorbing a part of light emitted by the radiation source and emitting light of wavelength different from that of the absorbed light; wherein said at least one phosphor is a cerium-activated carbidonitridosilicate of general formula $(RE_{1-z})_{2-a}EA_a\ Si_4N_{6+a}C_{1-a}:Ce_z$ wherein $0 \leq a < 1$, $0 < z \leq 0.2$, EA is at least one earth alkaline metal chosen from the group of calcium, barium and strontium and RE is a least one rare earth metal chosen from the group of yttrium, gadolinium and lutetium.

An illumination system according to the present invention can provide a composite white output light that is well-balanced with respect to color. In particular, the composite white output light has a greater amount of emission in the red color range than the conventional lamp. This characteristic makes the device ideal for applications in which a true color rendition is required.

Such applications of the invention include inter alias traffic lighting, street lighting, security lighting and lighting of automated factory, and signal lighting for cars and traffic.

Especially contemplated as the radiation source is a light emitting diode.

According to a first aspect of the invention a white light illumination system comprises a blue-light emitting diode having a peak emission wavelength in the range of 420 to 480 nm as a radiation source and a fluorescent material comprising at least one phosphor, that is a cerium-activated carbidonitridosilicate of general formula $(RE_{1-z})_{2+a}EA_a\ Si_4N_{6+a}C_{1-a}:Ce_z$ wherein $0 \leq a < 1$, $0 < z \leq 0.2$, Ea is at least one earth alkaline metal chosen from the group of calcium, barium and strontium and Re is a least one rare earth metal chosen from the group of yttrium, gadolinium and lutetium.

Such illumination system will provide white light in operation. The blue light emitted by the LED excites the phosphor, causing it to emit yellow light. The blue light emitted by the LED is transmitted through the phosphor and is mixed with the yellow light emitted by the phosphor. The viewer perceives the mixture of blue and yellow light as white light.

An essential factor is that the yellow to red phosphors of the cerium-activated carbido-nitridosilicate type are so broad-banded that they also have a sufficient proportion of the emission throughout the whole spectral region.

According to one embodiment the invention provides a white light illumination system comprising a blue-light emitting diode having a peak emission wavelength in the range of 420 to 480 nm as a radiation source and a fluorescent material comprising a cerium-activated carbido-nitridosilicate of general formula $(RE_{1-z})_{2-a}EA_a\ Si_4N_{6+a}C_{1-a}{:}Ce_z$ wherein $0 \leq a < 1$, $0 < z \leq 0.2$, and Re is a least one rare earth metal chosen from the group of yttrium, gadolinium and lutetium and at least one second phosphor.

When the fluorescent material comprises a phosphor blend of a phosphor of the cerium-activated carbido-nitridosilicate type and at least one second phosphor the color rendition of the white light illumination system according to the invention may be further improved.

In particular, the fluorescent material may a phosphor blend, comprising a cerium activated carbido-nitridosilicate of general formula $(RE_{1-z})_{2-a}EA_a\ Si_4N_{6+a}C_{1-a}{:}Ce_z$ wherein $0 \leq a < 1$, $0 < z \leq 0.2$, and Re is a least one rare earth metal chosen from the group of yttrium, gadolinium and lutetium and a red phosphor.

Such red phosphor may be selected from the group of Eu(II)-activated phosphors, selected from the group $(Ca_{1-x}Sr_x)$ S:Eu, wherein $0 \leq x \leq 1$ and $(Sr_{1-x-y}Ba_xCa_y)_{2-z}Si_{5-a}Al_aN_{8-a}O_a{:}Eu_z$ wherein $0 \leq a < 5$, $0 < x \leq 1$, $0 \leq y \leq 1$ and $0 < z \leq 1$.

Otherwise the fluorescent material may be a phosphor blend, comprising a cerium activated carbido-nitridosilicate of general formula $(RE_{1-z})_{2-a}EA_a\ Si_4N_{6+a}C_{1-a}{:}Ce_z$ wherein $0 \leq a < 1$, $0 < z \leq 0.2$, and Re is a least one rare earth metal chosen from the group of yttrium, gadolinium and lutetium and a green phosphor. Such green phosphor may be selected from the group comprising $(Ba_{1-x}Sr_x)_2\ SiO_4$: Eu, wherein $0 \leq x \leq 1$, $SrGa_2S_4$:Eu and $SrSi_2N_2O_2$ Eu.

The emission spectrum of such a fluorescent material comprising additional phosphors has the appropriate wavelengths to obtain together with the blue light of the LED and the yellow to red light of the cerium-activated carbido-nitridosilicate type phosphor according to the invention a high quality white light with good color rendering at the required color temperature.

According to another embodiment of the invention there is provided a white light illumination system, wherein the radiation source is selected from the light emitting diodes having an emission with a peak emission wavelength in the UV-range of 200 to 420 nm and the fluorescent material comprises at least one phosphor, that is a cerium-activated carbido-nitridosilicate of general formula $(RE_{1-z})_{2-a}EA_a\ Si_4N_{6+a}C_{1-a}{:}Ce_z$ wherein $0 \leq a < 1$, $0 < z \leq 0.2$, Ea is at least one earth alkaline metal chosen from the group of calcium, barium and strontium and Re is a least one rare earth metal chosen from the group of yttrium, gadolinium and lutetium and a second phosphor.

In particular, the fluorescent material may comprise a white light emitting phosphor blend, comprising a cerium-activated carbido-nitridosilicate of general formula $(RE_{1-z})_{2-a}EA_a\ Si_4N_{6+a}C_{1-a}{:}Ce_z$ wherein $0 \leq a < 1$, $0 < z \leq 0.2$, and Re is a least one rare earth metal chosen from the group of yttrium, gadolinium and lutetium and a blue phosphor.

Such blue phosphor may be selected from the group comprising $BaMgAl_{10}O_{17}$:Eu, $Ba_5SiO_4(Cl,Br)_6$:Eu which includes at least one of Cl and Br, $CaLn_2S_4Ce$ and $(Sr,Ba,Ca)_5(PO_4)_3Cl$:Eu which includes at least one of Sr, Ba and Ca.

A second aspect of the present invention provides an illumination system providing red to yellow light. Applications of the invention include security lighting as well as signal lighting for cars and traffic.

Especially contemplated is a yellow to red light illumination system, wherein the radiation source is selected from the blue light emitting diodes having an emission with a peak emission wavelength in the range of 400 to 480 nm a and the fluorescent material comprises at least one phosphor, that is a cerium-activated carbido-nitridosilicate of general formula $(RE_{1-z})_{2-a}EA_a\ Si_4N_{6+a}C_{1-a}{:}Ce_z$ wherein $0 \leq a < 1$, $0 < z \leq 0.2$, Ea is at least one earth alkaline metal chosen from the group of calcium, barium and strontium and Re is a least one rare earth metal chosen from the group of yttrium, gadolinium and lutetium.

Also contemplated is a yellow to red light illumination system, wherein the radiation source is selected from the light emitting diodes having an emission with a peak emission wavelength in the UV-range of 200 to 420 nm and the fluorescent material comprises at least one phosphor that is a cerium-activated carbido-nitridosilicate of general formula $(RE_{1-z})_{2-a}EA_a\ Si_4N_{6+a}C_{1-a}{:}Ce_z$ wherein $0 \leq a < 1$, $0 < z \leq 0.2$, Ea is at least one earth alkaline metal chosen from the group of calcium, barium and strontium and Re is a least one rare earth metal chosen from the group of yttrium, gadolinium and lutetium.

Another aspect of the present invention provides a phosphor capable of absorbing a part of light emitted by the radiation source and emitting light of wavelength different from that of the absorbed light; wherein said phosphor is a cerium-activated carbido-nitridosilicate of general formula $(RE_{1-z})_{2-a}EA_a\ Si_4N_{6+a}C_{1-a}{:}Ce_z$ wherein $0 \leq a < 1$, $0 < z \leq 0.2$, Ea is at least an earth alkaline metal chosen from calcium, strontium and barium and Re is a least one rare earth metal chosen from the group of yttrium, gadolinium and lutetium.

The fluorescent material is excitable by UV-A emission lines which have such wavelengths as from 200 nm to 420 nm, but is excited with higher efficiency by blue light emitted by a blue light emitting diode having a wavelength around 400 to 480 nm. Thus the fluorescent material has ideal characteristics for conversion of blue light of nitride semiconductor light emitting component into white light.

These phosphors are broad band emitters wherein the visible emission is so broad that there is no 80 nm wavelength range where the visible emission is predominantly located. These cerium-activate d carbido-nitridosilicate phosphors emit a broad band in the red to yellow spectral range of the visible spectrum with very high. Total conversion efficiency can be up to 90%.

Additional important characteristics of the phosphors include 1) resistance to thermal quenching of luminescence at typical device operating temperatures (e.g. 80° C.); 2) lack of interfering reactivity with the encapsulating resins used in the device fabrication; 3) suitable absorptive profiles to minimize dead absorption within the visible spectrum; 4) a temporally stable luminous output over the operating lifetime of the device and; 5) compositionally controlled tuning of the phosphors excitation and emission properties.

These cerium-activated carbido-nitridosilicate type phosphors may also include praseodymium and other cations including mixtures of cations as co-activators. In particular, those carbido-nitridosilicate compositions having an coactivator cation selected from the group of praseodymium and samarium, present at low concentrations, are particularly desirable, since such compositions show an extra sharp line emission in the red region of the visible spectrum too.

In particular, the invention relates to specific phosphor composition $Y_2Si_4N_6C$:5% Ce which exhibit a high quantum efficiency of 80-90%, high absorbance in the range from 370 nm to 470 nm of 60-80%, an emission spectrum with a peak wave length of about 590 nm and low loss, below 10%, of the luminescent lumen output from room temperature to 100° C. due to thermal quenching.

Specific phosphor composition $Y_2Si_4N_6C$:5% Ce is especially valuable as the mixture of blue spectrum near 450 nm and yellow spectrum near 580 nm has been considered to be a white light source that shows the highest efficiency with respect to the optimization of dichromatic radiation type in terms of true color rendition.

These phosphors may have a coating selected from the group of fluorides and orthophosphates of the elements aluminum, scandium, yttrium, lanthanum gadolinium and lutetium, the oxides of aluminum, yttrium and lanthanum and the nitride of aluminum.

Figure 5:
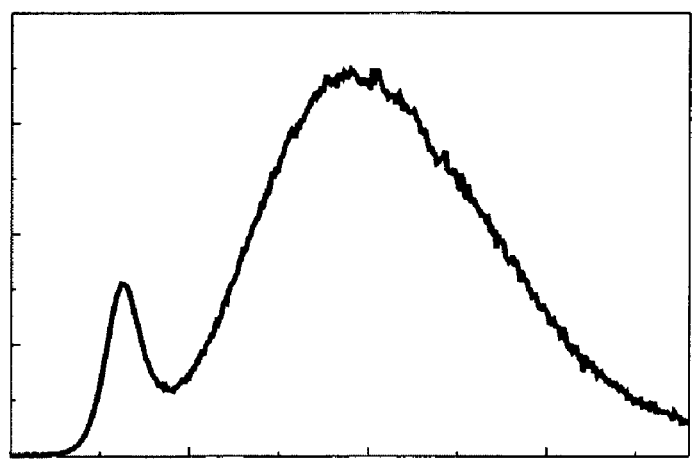

FIG. 5 discloses emission spectrum of a white LED with Tc=2960 K (CRI=76). comprising a blue LED at 460 nm and $Y_2Si_4N_6C$:5% Ce as a color converter.

Figure 6:
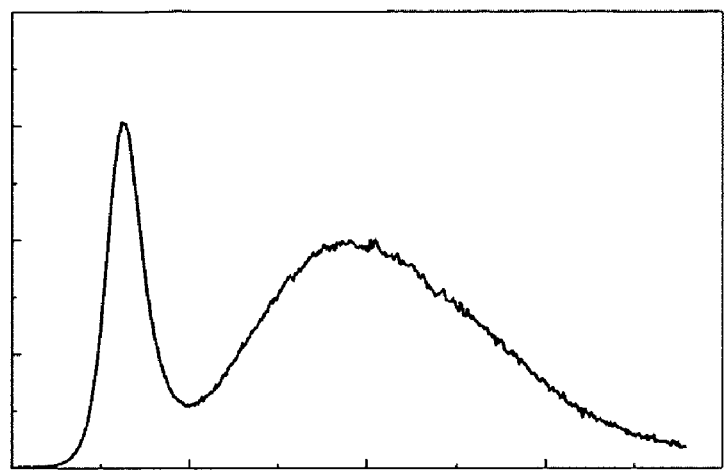

FIG. 6 discloses emission spectrum of a white LED with Tc=3720 K (CRI=84) comprising a blue LED at 460 nm and $Y_2Si_4N_6C$:5% Ce as a color converter.

Figure 7:
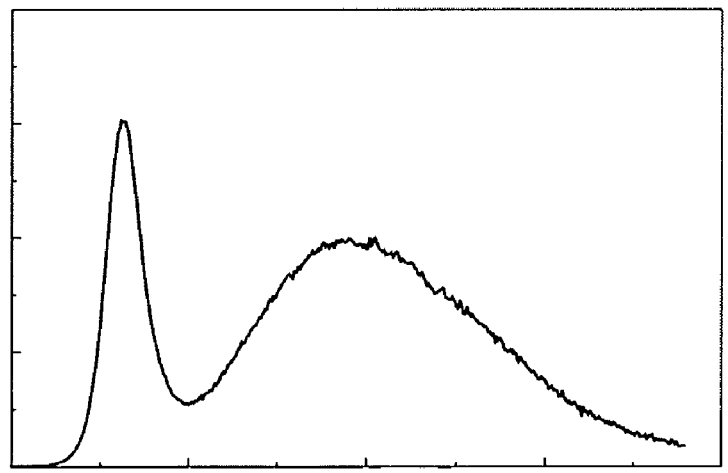
Figure 8:
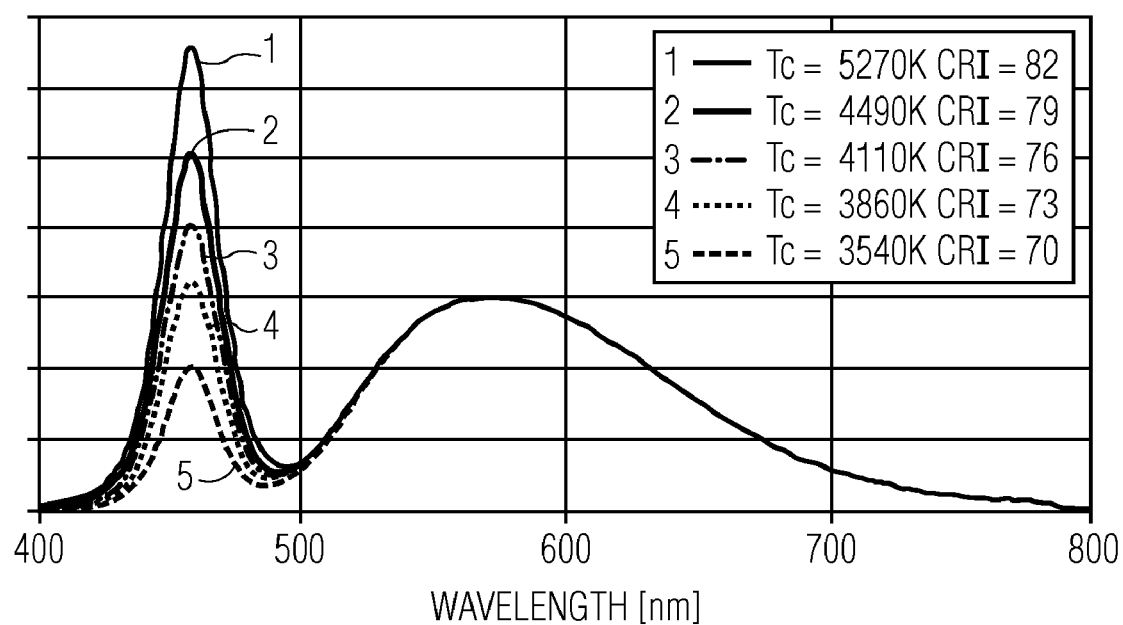

FIG. 7 discloses emission spectrum of a white LED with Tc=5490 K (CRI=80) comprising a blue LED at 460 nm and $Y_2Si_4N_6C$:5% Ce as a color converter FIG. 8 discloses emission spectra of commercial white LEDs comprising a 462 nm InGaN die and $(Y1-xGdx)3(A11-yGay)5O12$:Ce as a yellow phosphor.

The present invention focuses an a cerium-activated carbido-nitridosilicate as a phosphor in any configuration of an illumination system containing a radiation source, including, but not limited to discharge lamps, fluorescent lamps, LEDs, LDs and X-ray tubes. As used herein, the term "radiation" encompasses radiation in the UV, IR and visible regions of the electromagnetic spectrum.

While the use of the present phosphor is contemplated for a wide array of illumination, the present invention is described with particular reference to and finds particular application to light emitting diodes, especially UV- and blue-light-emitting diodes.

The fluorescent material according to the invention comprises as a cerium-activated carbido-nitridosilicate. The phosphor conforms to the general formula $(RE_{1-z})_{2-a}EA_a Si_4N_{6+a}C_{1-a}$:$Ce_z$ wherein $0\leq a<1$, $0<z\leq 0.2$, Re is a least one rare earth metal chosen from the group of yttrium, gadolinium and lutetium and Ea is as least one earth alkaline metal chosen from the group of calcium, strontium and barium. This class of phosphor material is based an activated luminescence of a carbide substituted nitridosilicate.

The phosphor of general formula $(RE_{1-z})_{2-a}EA_a Si_4 N_{6+a}C_{1-a}$:$Ce_z$ wherein $0\leq a<1$, $0<z\leq 0.2$, comprises a host lattice with the main components of silicon and nitrogen. It also comprises carbon (—IV). The host lattice is supposed to have a structure consisting of (N—Si—N—) and (C—Si—N)-units in a three-dimensional network, wherein silicon is tetrahedrically surrounded by nitrogen and carbon.

The incorporation of carbon in the host lattice increases the proportion of covalent bonding and ligand-field splitting. As a consequence this leads to a shift of excitation and emission bands to longer wavelengths in comparison to the basic nitridosilicate lattices.

Within the three dimensional network metal ions such as the rare earth metals and earth alkaline metals as well as Ce(III) and eventually praseodymium(III) are incorporated. Preferably the rare earth metals are selected from yttrium, gadolinium, lutetium, and the earth alkaline metals are selected from calcium, strontium and barium are incorporated.

The host lattice for those materials may be four element (two cation) carbido-nitridosilicate such as yttrium carbido-nitridosilicate $Y_2Si_4N_6C$, for example, or may comprise more that four elements such as yttrium-calcium carbido-nitridosilicate $Y_{1.8}Ca_{0.2}Si_4N_{6.2}C_{0.8}$ or $(Y,Gd,Lu)_2Si_4N_6C$ for example.

Especially, within the basic host lattice substitution of divalent rare earth metal ions for divalent earth alkaline metals is possible.

When substituting earth alkaline metals Ea with rare earth metals Re, the proportion is preferably within the range from 0.2:0.8 to 0.8:0.2.

Equally the rare earth metals can be substituted by each other.

Substituting rare earth metal ions in carbido-nitridosilicate host will shift the spectral position of the cerium emission to produce a range of colours. It was found that the easiest method is to replace some of the yttrium ions in the host lattice with other rare earths metals—Those with larger ionic radii, such as gadolinium, produce a red shift and those with smaller ionic radii, such as lutetium, produce a blue shift.

This means that, when emission of more reddish light is required, it can be achieved by increasing the degree of substitution with Gd. But when the Gd content is increased, luminance of light emitted by photoluminescence under blue light tends to decrease, therefore yttrium is preferred as the rare earth metal.

The proportion z of Ce is preferably in a range of $0.003<z<0.2$.

When the proportion z of Ce is 0.003 or lower, luminance decreases because the number of excited emission centers of photoluminescence due to Ce decreases and, when the z is greater than 0.2, density quenching occurs. Density quenching refers to the decrease in emission intensity which occurs when the concentration of an activation agent added to increase the luminance of the fluorescent material is increased beyond an optimum level.

Replacing some of the cerium in a cerium-activated carbido-nitridosilicate by praseodymium as a co-activator has the effect, that the praseodymium produces secondary emission that is concentrated in the red region of the visible spectrum, instead of a typical broadband secondary emission from cerium-activated carbido-nitridosilicate phosphor that is generally centered in the yellow region of the visible spectrum. The amount of praseodymium as a co-activator can vary, depending on the amount of red color that may be required in the white output light for a particular application.

These cerium-activated carbido-nitridosilicate phosphors are responsive to more energetic portions of the electromagnetic spectrum than the visible portion of the spectrum.

In particular, the phosphors according to the invention are especially excitable by UV emission lines which have such wavelengths as 200 to 420 nm, but is excited with higher efficiency by LED light emitted by a blue light emitting component having a wavelength from 400 to 480 nm. Thus the fluorescent material has ideal characteristics for converting blue light of nitride semiconductor light emitting component into white light.

The method for producing a cerium-activated carbido-nitridosilicate phosphor of the present invention is not particularly restricted, and it can be produced by firing a mixture of metal compounds which provides a cerium-activated carbido-nitridosilicate fluorescent material.

For example, one of the preferable compound represented by $Y_2Si_4N_6C$:5% Ce is produced by the method where yttrium metal, carbon, silicon diimide and cerium(111) fluoride as the starting materials are weighed and compounded to give a molar ratio Y:Si:N:C:Ce of 1.95:4:6:1:0.05 (or Y:Si:N:C:Ce of molar ratio 2:4:6:1:0.05, or Y:Si:N:C of molar ratio 2:4:6:1), and then be fired.

Starting materials having a high purity of 99.9% or more and in the form of fine particle having an average particle size of 1 μm or less can be preferably used.

In the first place, the staring materials (i.e., alkaline earth metal halide, cerium compound such as cerium halide, alkali metal halide, and the rare earth metals) are well mixed by a dry and/or wet process utilizing any of various known mixing method such as ball mills, V-shaped mixers, stirrers and the like.

The obtained mixture is placed in a heat-resistance container such as an alumina crucible and a tungsten boat, and then fired in an electric furnace. A preferred temperature for the firing ranges from 1,600 to 1,800 degree C.

The firing atmosphere is not particularly restricted, and for example, it is preferable to conduct firing in a reducing atmosphere such as an atmosphere comprising inert gas such as nitrogen and argon and the like, and hydrogen in a proportion of 0.1 to 10 volume %. The firing period is determined upon various conditions such as the amount of the mixture charged in the container, the firing temperature and the temperature at which the product is taken out of the furnace, but generally in the range of 10 to 14 hours.

Fluorescent material obtained by the above-mentioned method may be ground by using, for example, a ball mill, jet mill and the like. Moreover, washing and classification may be conducted. For enhancing the crystallinity of the resulting granular phosphor re-firing is suggested.

Figure 3:
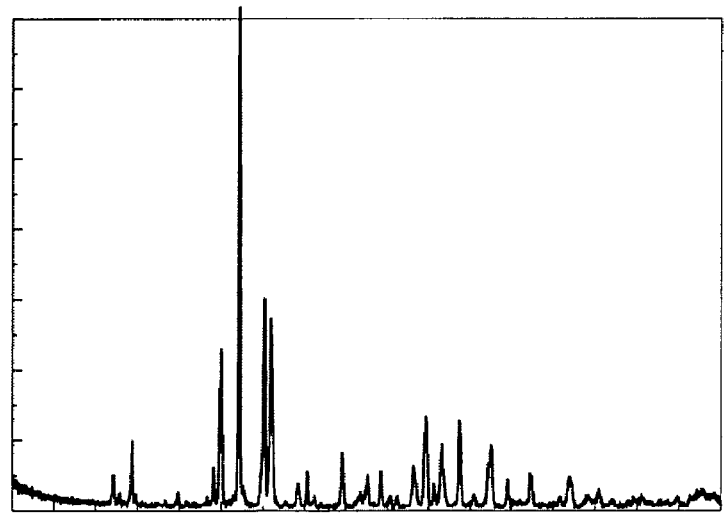
FIG. 3 shows a XRD pattern of $Y_2Si_4N_6C$:5% Ce measured by Cu Kα radiation.

After firing, the powders were characterized by powder X-ray diffraction (Cu, Kα-line), which showed that all compounds had formed. FIG. 3 shows the X-ray diffraction data of $Y_2Si_4N_6C$:5% Ce.

Each phosphor of the cerium-activated carbido-nitridosilicate type emits a yellow to red fluorescence when excited by radiation of the UVA or blue range of the electromagnetic spectrum.

Figure 4:
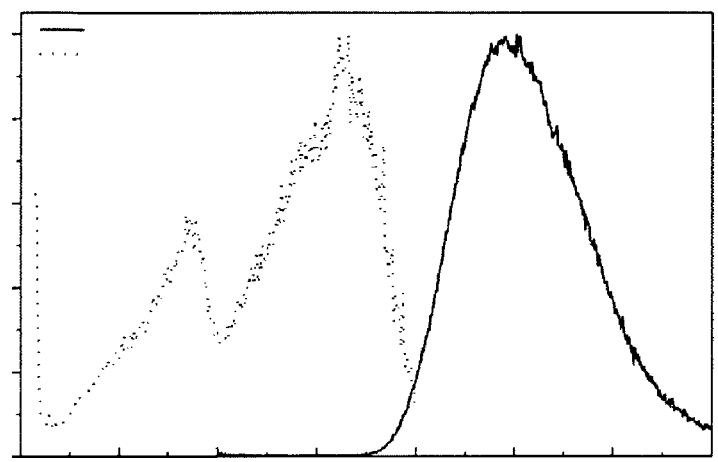
FIG. 4 shows excitation and emission spectra of $Y_2Si_4N_6C$: 5% Ce.

In FIG. 4 of the drawings accompanying this specification, the excitation and emission spectra of $Y_2Si_4N_6C$:5% Ce are given.

When excited with radiation of wavelength 355 nm, these carbido-nitridosilicate phosphor is found to give a broad band emission, which peak wave length at 590 nm and a tail emission up to 700 nm.

From the excitation spectra, it is also clear that these cerium-activated lutetium aluminum-garnet phosphors can be excited efficiently with radiation of wavelength of about 254 nm as well as about 460 nm.

For preparation of a cerium-activated carbido-nitridosilicate $Y_2Si_4N_6C$:5% Ce as precursor material 43.9 g (0.494 mol) Y metal, 99.8 (1.0 mol) $Si(NH2)_2$, 25.8 g (2.15 mol) C, and 5.1 g (0.026 mol) CeF3 are thoroughly mixed in an inert atmosphere (nitrogen).

After mixing, the powder is fired in an H2/N2=5/95 atmosphere for 12 hrs at 1700° C. The resulting luminescent material is then ground, washed with water and ethanol, dried and sieved. A yellow powder is obtained, which efficiently luminescence at 590 nm under UV and blue excitation. The color point is at x=0.496 and y=0.483. The lumen equivalent is 330 lm/W.

The phosphor $Y_2Si_4N_6C$:5% Ce is, because of carbido-nitridosilicate structure, resistant to heat, light and moisture, and is capable of absorbing excitation light having a peak at a wavelength near 430 nm as shown in FIG. 4. it also emits light of broad spectrum having a peak near 590 nm tailing out to 700 nm as shown in FIG. 4.

Preferably the cerium-activated carbido-nitridosilicate type phosphors according to the invention may be coated with a thin, uniform protective layer of one or more compounds selected from the group formed by the fluorides and orthophosphates of the elements aluminum, scandium, yttrium, lanthanum gadolinium and lutetium, the oxides of aluminum, yttrium and lanthanum and the nitride of aluminum.

The protective layer thickness customarily ranges from 0.001 to 0.2 gm and, thus, is so thin that it can be penetrated by the radiation of the radiation source without substantial loss of energy. The coatings of these materials on the phosphor particles can be applied, for example, by deposition from the gas phase a wet-coating process.

The invention also concerns an illumination system comprising a radiation source and a fluorescent material comprising at least one cerium-activated carbido-nitridosilicate of general formula $(RE_{1-z})_{2-a}EA_a Si_4N_{6+a}C_{1-a}:Ce_z$ wherein $0 \leq a < 1$, $0 < z \leq 0.2$, Ea is at least one an earth alkaline metal chosen from calcium, strontium and barium and Re is a least one rare earth metal chosen from the group of yttrium, gadolinium and lutetium.

Radiation sources include semiconductor optical radiation emitters and other devices that emit optical radiation in response to electrical excitation. Semiconductor optical radiation emitters include light emitting diode LED Chips, light emitting polymers (LEPs), organic light emitting devices (OLEDs), polymer light emitting devices (PLEDs), etc.

Moreover, light emitting components such as those found in discharge lamps and fluorescent lamps, such as mercury low and high pressure discharge lamps, sulfur discharge lamps, and discharge lamps based an molecular radiators are also contemplated for use as radiation sources with the present inventive phosphor compositions.

In a preferred embodiment of the invention the radiation source is a light-emitting diode.

Any configuration of an illumination system which includes a LED and a cerium activated carbido-nitridosilicate phosphor composition is contemplated in the present invention, preferably with addition of other well-known phosphors, which can be combined to achieve a specific color or white light when irradiated by a LED emitting primary UV or blue light as specified above.

A detailed construction of one embodiment of such illumination system comprising a radiation source and a fluorescent material shown in FIG. 1 will now be described.

Figure 1:
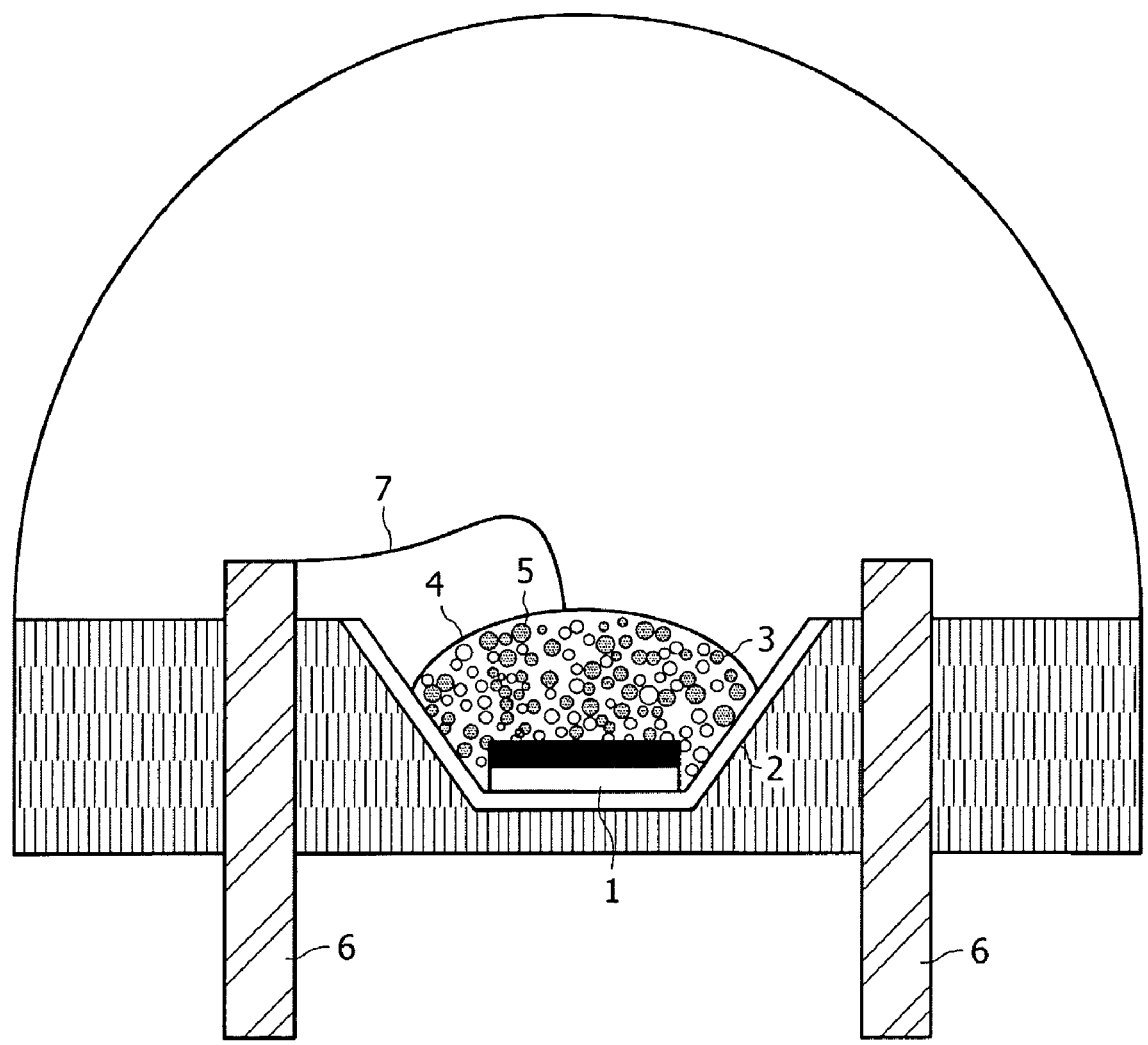
FIG. 1 shows a schematic view of a dichromatic white LED lamp comprising a phosphor of the present invention positioned in a pathway of light emitted by an LED structure.

FIG. 1 shows a schematic view of a chip type light emitting diode with a coating 4 comprising the fluorescent material 3. The device comprises chip type light emitting diode (LED) 1 as a radiation source. The light-emitting diode dice is positioned in a reflector cup lead frame 2. The dice 1 is connected via a bond wire 7 to a first terminal 6, and directly to a second electric terminal 6. The recess of the reflector cup is filled with a coating material 4 which contains a fluorescent material 3 according to the invention to form a coating layer which is embedded in the reflector cup. The phosphors are applied either separately or in a mixture.

The coating material 4 typically comprises a polymer 5 for encapsulating the phosphor or phosphor blend 3. In these embodiments, the phosphor or phosphor blend 3 should exhibit high stability properties against the encapsulant. Preferably, the polymer 5 is optically clear to prevent significant light scattering. A variety of polymers 5 are known in the LED industry for making LED lamps.

In one embodiment, the polymer is selected from the group consisting of epoxy and silicone resins Adding the phosphor mixture to a liquid that is a polymer precursor can perform encapsulation. For example, the phosphor mixture can be a granular powder. Introducing phosphor particles into polymer precursor liquid results in formation of a slurry (i.e. a suspension of particles). Upon polymerization, the phosphor mixture is fixed rigidly in place by the encapsulation. In one embodiment, both the fluorescent material and the LED dice are encapsulated in the polymer.

The transparent coating material may comprise light-diffusing particles, advantageously so-called diffusers. Examples of such diffusers are mineral fillers, in particular $CaF_2$, $TiO_2$, $SiO_2$, $CaCO_3$ or $BaSO_4$ or else organic pigments. These materials can be added in a simple manner to the above-mentioned resins.

In operation, electrical power is supplied to the dice to activate the dice. When activated, the dice emits the primary light, e.g. blue light. A portion of the emitted primary light is completely or partially absorbed by the fluorescent material in the coating layer. The fluorescent material then emits secondary light, i.e., the converted light having a longer peak wavelength, primarily yellow in a sufficiently broadband (specifically with a significant proportion of red) in response to absorption of the primary light. The remaining unabsorbed portion of the emitted primary light is transmitted through the fluorescent layer, along with the secondary light. The encapsulation directs the unabsorbed primary light and the secondary light in a general direction as output light. Thus, the output light is a composite light that is composed of the primary light emitted from the die and the secondary light emitted from the fluorescent layer.

Figure 2:
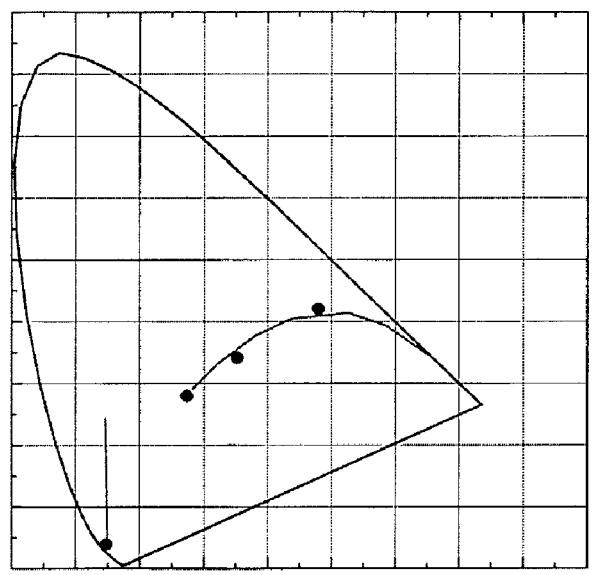
FIG. 2 shows the coordinates of the radiation of a white LED with Tc=2960 K (CRI=76) comprising a blue LED at 460 nm and $Y_2Si_4N_6C$:5% Ce as a color converter in the chromaticity diagram of the Commission Internationals de l'Eclairage ("CIE").

The color points corresponding to a black body at various temperatures are given by the black body point (BBL). Because the color emitted from a black body is considered to be white, and white light is generally desirable for a lamp, it is generally desirable that color point of the light emitted from the luminescent material of a luminescent lamp fall an or near the BBL. A portion of the BBL is shown in FIG. 2 with three color temperature points highlighted an the BBL corresponding to white light emitting LEDs, whose emission spectra are given in FIGS. 5, 6 and 7.

The color temperature or color point of the output light of an illumination system according to the invention will vary depending upon the spectral distributions and intensities of the secondary light in comparison to the primary light.

Firstly, the color temperature or color point of the primary light can be varied by a suitable choice of the light emitting diode Secondly, the color temperature or color point of the secondary light can be varied by a suitable choice of the phosphor in the luminescent material, its particle size and its concentration. Furthermore, these arrangements also advantageously afford the possibility of using phosphor blends in the luminescent material, as a result of which, advantageously, the desired hue can be set even more accurately.

According to one aspect of the invention the output light may have a spectral distribution such that it appears to be "white" light.

In a first embodiment, a white-light emitting illumination system according to the invention can advantageously be produced by choosing the luminescent material such that a blue radiation emitted by a blue light emitting diode is converted into complementary wavelength ranges, to form dichromatic white light. In this case, yellow light is produced by means of the luminescent materials, that comprise a cerium-activated carbido-nitridosilicate phosphor. Also a second red fluorescent material can be used, in addition, in order to improve the color rendition of this illumination system.

Particularly good results are achieved with a blue LED whose emission maximum lies at 400 to 480 nm. An optimum has been found to lie at 445 to 465 nm, taking particular account of the excitation spectrum of the cerium-activated carbido-nitridosilicate.

A white-light emitting illumination system according to the invention can particularly preferably be realized by admixing the inorganic luminescent material
$Y_2Si_4N_6C$:5% Ce with a silicon resin used to produce the luminescence conversion encapsulation or layer.

Part of a blue radiation emitted by a 462 nm InGaN light emitting diode is shifted by the inorganic luminescent material $Y_2Si_4N_6C$:5% Ce into the yellow spectral region and, consequently, into a wavelength range which is complementarily colored with respect to the color blue. A human observer perceives the combination of blue primary light and the secondary light of the yellow-emitting phosphor as white light.

The hue (color point in the CIE chromaticity diagram) of the white light thereby produced can in this case be varied by a suitable choice of the phosphor in respect of mixture and concentration, see Table 2.

TABLE 1

Color point x, y and color rendering (Ra8) of white LEDs comprising a blue emitting die (462 nm) and a yellow phosphor (Y2Si4N6C: 5% Ce) as function of color temperature T,

| $T_c$ [K] | x | y | $Ra_8$ |
|---|---|---|---|
| 2870 | 0.470 | 0.452 | 74 |
| 2960 | 0.454 | 0.433 | 76 |
| 3100 | 0.434 | 0.411 | 78 |
| 3320 | 0.411 | 0.383 | 81 |
| 3720 | 0.382 | 0.349 | 84 |
| 4780 | 0.345 | 0.306 | 83 |
| 5490 | 0.332 | 0.290 | 80 |

Said white light illumination device has color coordinates substantially at a black body point of a CIE chromaticity diagram FIG. 2.

FIGS. 5, 6 and 7 show the emission spectra of such illumination system comprising blue emitting InGaN die with primary emission at 462 nm and $Y_2Si_4N_6C$:5% Ce as the fluorescent material, which together form an overall spectrum which conveys a white color sensation of high quality. The associated color points for different coating thicknesses are x=0.454, y=0.433 at color temperature $T_c$=2960 Kelvin, CRI 76; x=0.382 and y=0.349 at color temperature $T_c$=3720 Kelvin, CRI=84. and x=0.332, y=0.290 at color temperature 5490, CRI=80.

When compared with the spectral distribution of the white output light generated by the prior art LED of Shimizu et al., (FIG. 8) the apparent difference in the spectral distribution is the shift of the peak wavelength which is in the red region of the visible spectrum. Thus, the white output light generated by the illumination system has a significant additional amount of red color, as compared to the output light generated by the prior art LED of Shimizu et al.

In a second embodiment, a white-light emitting illumination system according to the invention can advantageously be produced by choosing the luminescent material such that a blue radiation emitted by the blue light emitting diode is converted into complementary wavelength ranges, to form polychromatic white light. In this case, yellow light is produced by means of the luminescent materials, that comprise a blend of phosphors including cerium-activated carbido-nitridosilicate phosphor and a second phosphor.

Yielding white light emission with even high color rendering is possible by using red and green broad band emitter phosphors covering the whole spectral range together with a blue-emitting LED and a yellow to red emitting cerium-activated carbido-nitridosilicate phosphor.

Useful second phosphors and their optical properties are summarized in the following table 2.

TABLE 2

| Composition | $\lambda_{max}$ [nm] | Color point x, y |
|---|---|---|
| $(Ba_{1-x}Sr_x)_2SiO_4$:Eu | 523 | 0.272, 0.640 |
| $SrGa_2S_4$:Eu | 535 | 0.270, 0.686 |
| $SrSi_2N_2O_2$:Eu | 541 | 0.356, 0.606 |
| SrS: Eu | 610 | 0.627, 0.372 |
| $(Sr_{1-x-y}Ca_xBa_y)_2Si_5N_8$:Eu | 615 | 0.615, 0.384 |
| $(Sr_{1-x-y}Ca_xBa_y)_2Si_{5-x}Al_xN_{8-x}O_x$:Eu | 615-650 | * |
| CaS:Eu | 655 | 0.700, 0.303 |
| $(Sr_{1-x}Ca_x)$S:Eu | 610-655 | * |

The luminescent materials may be a blend of two phosphors, a yellow to red cerium activated carbido-nitridosilicate phosphor and a red phosphor selected from the group $(Ca_{1-x}Sr_x)$ S:Eu, wherein $0\leq x\leq 1$ and $(Sr_{1-x-y}Ba_xCa_y)_{2-z}Si_{5-a}Al_aN_{8-a}O_a$:$Eu_z$ wherein $0\leq a<5$, $0<x\leq 1$, $0\leq y\leq 1$ and $0<z\leq 0.2$.

The luminescent materials may be a blend of two phosphors, a yellow to red cerium activated carbido-nitridosilicate phosphor and a green phosphor selected from the group comprising $(Ba_{1-x}Sr)_2SiO_4$: Eu, wherein $0\leq x\leq 1$, $SrGa_2S_4$:Eu and $SrSi_2N_2O_2$:Eu.

The luminescent materials may be a blend of three phosphors, a yellow to red cerium activated carbido-nitridosilicate phosphor, a red phosphor selected from the group $(Ca_{1-x}Sr_x)$ S:Eu, wherein $0\leq x\leq 1$ and $(Sr_{1-x-y}Ba_xCa_y)_{2-z}Si_{5-a}Al_a N_{8-a}O_a$:$Eu_z$ wherein $0\leq a<5$, $0<x\leq 1$, $0\leq y\leq 1$ and $0<z\leq 0.2$.and a green phosphor selected from the group comprising $(Ba_{1-x}Sr_x)_2SiO_4$: Eu wherein $0\leq\leq x\leq 1$, $SrGa_2S_4$:Eu and $SrSi_2N_2O_2$:Eu.

Example given, white-light emitting illumination system according to the invention can particularly preferably be realized by admixing the inorganic luminescent material comprising a mixture of three phosphors with an silicon resin used to produce the luminescence conversion encapsulation or layer. A first phosphor (1) is the yellow-emitting carbido-nitridosilicate $Y_2Si_4N_6C$:5% Ce, the second phosphor (2) is the red-emitting CaS:Eu, and the third (3) is a green-emitting phosphor of type $SrSi_2N_2O_2$:Eu.

Part of a blue radiation emitted by a 462 nm InGaN light emitting diode is shifted by the inorganic luminescent material $Y_2Si_4N_6C$:5% Ce into the yellow spectral region and, consequently, into a wavelength range which is complementarily colored with respect to the color blue. Another part of blue radiation emitted by a 462 nm InGaN light emitting diode is shifted by the inorganic luminescent material CaS:Eu into the red spectral region. Still another part of blue radiation emitted by a 462 nm InGaN light emitting diode is shifted by the inorganic luminescent material $SrSi_2N_2O_2$:Eu into the green spectral region. A human observer perceives the combination of blue primary light and the polychromatic secondary light of the phosphor blend as white light.

The hue (color point in the CIE chromaticity diagram) of the white light thereby produced can in this case be varied by a suitable choice of the phosphors in respect of mixture and concentration.

In a third embodiment, a white-light emitting illumination system according to the invention can advantageously be produced by choosing the luminescent material such that a UV radiation emitted by the UV light emitting diode is converted into complementary wavelength ranges, to form dichromatic white light. In this case, the yellow and blue light is produced by means of the luminescent materials. Yellow light is produced by means of the luminescent materials, that comprise a cerium-activated carbido-nitridosilicate phosphor. Blue light is produced by means of the luminescent materials, that comprise a blue phosphor selected from the group comprising $BaMgAl_{10}O_{17}$:Eu, $Ba_5SiO_4(Cl,Br)_6$:Eu, $CaLn_2S_4$:Ce and $(Sr,Ba,Ca)_5(PO_4)_3Cl$:Eu.

Particularly good results are achieved in conjunction with a UVA light emitting diode, whose emission maximum lies at 300 to 420 nm. An optimum has been found to lie at 365 nm, taking particular account of the excitation spectrum of the carbido-nitridosilicate.

In a fourth embodiment, a white-light emitting illumination system according to the invention can advantageously be produced by choosing the luminescent material such that UV radiation emitted by a UV emitting diode is converted into complementary wavelength ranges, to form polychromatic white light e.g. by additive color triads, for example blue, green and red.

In this case, the yellow to red and the green and blue light is produced by means of the luminescent materials.

Also a second red fluorescent material can be used, in addition, in order to improve the color rendition of this illumination system.

Yielding white light emission with even high color rendering is possible by using blue and green broad band emitter phosphors covering the whole spectral range together with a UV emitting LED and a yellow to red emitting cerium-activated carbido-nitridosilicate phosphor.

The luminescent materials may be a blend of three phosphors, a yellow to red cerium activated carbido-nitridosilicate phosphor, a blue phosphor selected from the group comprising $BaMgAl_{10}O_{17}$:Eu, $Ba_5SiO_4(Cl,Br)_6$:Eu, $CaLn_2S_4$Ce and $(Sr,Ba,Ca)_5(PO_4)_3Cl$:Eu and a green phosphor selected from the group comprising $(Ba_{1-x}Sr_x)_2SiO_4$: Eu wherein $0\leq x\leq 1$, $SrGa_2S_4$:Eu and $SrSi_2N_2O_2$:Eu.

The hue (color point in the CIE chromaticity diagram) of the white light thereby produced can in this case be varied by a suitable choice of the phosphors in respect of mixture and concentration.

According to further aspect of the invention an illumination system that emits output light having a spectral distribution such that it appears to be "yellow to red" light is contemplated.

Fluorescent material comprising cerium activated carbido-nitridosilicate as phosphor is particularly well suited as a yellow component for stimulation by a primary UVA or blue radiation source such as, for example, an UVA-emitting LED or blue-emitting LED.

It is possible thereby to implement an illumination system emitting in the yellow to red regions of the electromagnetic spectrum.

In a fifth embodiment, a yellow-light emitting illumination system according to the invention can advantageously be produced by choosing the luminescent material such that a blue radiation emitted by the blue light emitting diode is converted into complementary wavelength ranges, to form dichromatic yellow light.

In this case, yellow light is produced by means of the luminescent materials, that comprise a cerium-activated carbido-nitridosilicate phosphor.

Particularly good results are achieved with a blue LED whose emission maximum lies at 400 to 480 nm. An optimum has been found to lie at 445 to 465 nm, taking particular account of the excitation spectrum of the carbido-nitridosilicate.

A yellow-light emitting illumination system according to the invention can particularly preferably be realized by admixing an excess of the inorganic luminescent material $Y_2Si_4N_6C$:5% Ce with a silicon resin used to produce the luminescence conversion encapsulation or layer. Part of a blue radiation emitted by a 462 nm InGaN light emitting diode is shifted by the inorganic luminescent material $Y_2Si_4N_6C$:5% Ce into the yellow spectral region and, consequently, into a wavelength range which is complementarily colored with respect to the color blue. A human observer perceives the combination of blue primary light and the excess secondary light of the yellow-emitting phosphor as yellow light.

The color output of the LED-phosphor system is very sensitive to the thickness of the phosphor layer, if the phosphor layer is thick and comprises an excess of a yellow cerium activated carbido-nitridosilicate phosphor, then a lesser amount of the blue LED light will penetrate through the thick phosphor layer. The combined LED-phosphor system will then appear yellow to red, because it is dominated by the yellow to red secondary light of the phosphor. Therefore, the thickness of the phosphor layer is a critical variable affecting the color output of the system.

The hue (color point in the CIE chromaticity diagram) of the yellow light thereby produced can in this case be varied by a suitable choice of the phosphor in respect of mixture and concentration.

In a sixth embodiment, a white-light emitting illumination system according to the invention can advantageously be produced by choosing the luminescent material such that a UV radiation emitted by the UV emitting diode is converted entirely into monochromatic yellow to red light. In this case, the yellow to red light is produced by means of the luminescent materials.

A yellow-light emitting illumination system according to the invention can particularly preferably be realized by admixing the inorganic luminescent material $Y_2Si_4N_6C$:5% Ce with an silicon resin used to produce the luminescence conversion encapsulation or layer. Part of a blue radiation emitted by a 462 nm InGaN light emitting diode is shifted by the inorganic luminescent material $Y_2Si_4N_6C$:5% Ce into the yellow spectral region. A human observer perceives the combination of UVA primary radiation and the secondary light of the yellow-emitting phosphor as yellow light.

The hue (color point in the CIE chromaticity diagram) of the white light thereby produced can in this case be varied by a suitable choice of the phosphor in respect of mixture and concentration.

The invention claimed is:

1. Illumination system, comprising a radiation source and a fluorescent material comprising at least one phosphor capable of absorbing a part of light emitted by the radiation source and emitting light of wavelength different from that of the absorbed light; wherein said at least one phosphor is a cerium-activated carbido-nitridosilicate of general formula $(RE_{1-z})_{2-a}EA_aSi_4N_{6+a}C_{1-a}:Ce_z$ wherein $0 \leq a < 1$, $0 < z \leq 0.2$, EA is at least one earth alkaline metal selected from the group of calcium, strontium and barium, and RE is a least one rare earth metal chosen from the group of yttrium, gadolinium and lutetium.

2. Illumination system according to claim 1, wherein the radiation source is a light emitting diode.

3. Illumination system according to claim 1, wherein the radiation source is selected from the light emitting diodes having an emission with a peak emission wavelength in the range of 400 to 480 nm and wherein the fluorescent material comprising a cerium-activated carbido-nitridosilicate of general formula $(RE_{1-z})_{2-a}EA_aSi_4N_{6+a}C_{1-a}:Ce_z$ wherein $0 \leq a < 1$, $0 < z \leq 0.2$, EA is at least one earth alkaline metal selected from the group of calcium, strontium and barium, and RE is a least one rare earth metal chosen from the group of yttrium, gadolinium and lutetium.

4. Illumination system according to claim 1, wherein the radiation source is selected from the light emitting diodes having an emission with a peak emission wavelength in the UV range of 200 to 420 nm and wherein the fluorescent material comprises a cerium-activated carbido-nitridosilicate of general formula $(RE_{1-z})_{2-a}EA_aSi_4N_{6+a}C_{1-a}:Ce_z$ wherein $0 \leq a < 1$, $0 < z \leq 0.2$, and EA is at least one earth alkaline metal selected from the group of calcium, strontium and barium, and RE is a least one rare earth metal chosen from the group of yttrium, gadolinium and lutetium.

5. Phosphor capable of absorbing a part of light emitted by the radiation source and emitting light of wavelength different from that of the absorbed light; wherein said phosphor is a cerium-activated carbido-nitridosilicate of general formula $(RE_{1-z})_{2-a}EA_aSi_4N_{6+a}C_{1-a}:Ce_z$ wherein $0 \leq a < 1$, $0 < z \leq 0.2$, EA is at least an earth alkaline metal chosen from calcium, strontium and barium and RE is a least one rare earth metal chosen from the group of yttrium, gadolinium and lutetium.

6. Phosphor according to claim 5, wherein said phosphor additionally comprises a co-activator selected from the group of praseodymium and samarium.

7. Phosphor according to claim 5, wherein said phosphor is a cerium-activated carbido-nitridosilicate of general formula $Y_2Si_4N_6C$:5% Ce.

8. Phosphor according to claim 5, wherein the phosphor has a coating selected from the group of fluorides and orthophosphates of the elements aluminum, scandium, yttrium, lanthanum gadolinium and lutetium, the oxides of aluminum, yttrium and lanthanum and the nitride of aluminum.

* * * * *